(12) United States Patent
Krogdahl et al.

(10) Patent No.: US 9,258,906 B2
(45) Date of Patent: Feb. 9, 2016

(54) LIQUID-BASED PRESSURE SENSITIVE ADHESIVE FOR GROUNDING APPLICATIONS

(71) Applicant: Apple Inc., Cupertino, CA (US)

(72) Inventors: James R. Krogdahl, Cupertino, CA (US); Benjamin J. Pope, Sunnyvale, CA (US); Dennis R. Pyper, San Jose, CA (US); Nicholas G. L. Merz, San Francisco, CA (US); Scott A. Myers, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 257 days.

(21) Appl. No.: 13/863,264

(22) Filed: Apr. 15, 2013

(65) Prior Publication Data
US 2014/0308465 A1  Oct. 16, 2014

(51) Int. Cl.
| | |
|---|---|
| *B29C 65/52* | (2006.01) |
| *B32B 37/12* | (2006.01) |
| *B32B 37/26* | (2006.01) |
| *B32B 38/10* | (2006.01) |
| *B32B 43/00* | (2006.01) |
| *C09J 5/02* | (2006.01) |
| *H05K 3/38* | (2006.01) |
| *C09J 5/00* | (2006.01) |
| *H05K 3/32* | (2006.01) |
| *H05K 3/36* | (2006.01) |

(52) U.S. Cl.
CPC . *H05K 3/386* (2013.01); *C09J 5/00* (2013.01); *H05K 3/323* (2013.01); *H05K 3/361* (2013.01); *C09J 2201/606* (2013.01); *C09J 2203/326* (2013.01); *C09J 2205/31* (2013.01); *Y10T 156/10* (2015.01); *Y10T 428/13* (2015.01); *Y10T 428/31678* (2015.04)

(58) Field of Classification Search
USPC ............. 156/247, 272.2, 273.3, 274.8, 275.3, 156/275.5, 275.7, 307.1, 307.3, 307.5
See application file for complete search history.

(56) References Cited

U.S. PATENT DOCUMENTS

| | | | | |
|---|---|---|---|---|
| 4,157,932 | A * | 6/1979 | Hirata | 156/310 |
| 5,611,884 | A * | 3/1997 | Bearinger et al. | 156/325 |
| 5,707,712 | A * | 1/1998 | Fujimura et al. | 428/195.1 |
| 6,134,776 | A | 10/2000 | Hoffmeyer | |
| 6,409,859 | B1 | 6/2002 | Chung | |
| 6,421,013 | B1 * | 7/2002 | Chung | 343/700 MS |
| 6,460,245 | B1 | 10/2002 | DiStefano | |
| 2003/0091777 | A1 | 5/2003 | Jones et al. | |
| 2012/0018211 | A1 | 1/2012 | Book | |
| 2013/0011683 | A1 | 1/2013 | Busman et al. | |

* cited by examiner

*Primary Examiner* — Sing P Chan
(74) *Attorney, Agent, or Firm* — Treyz Law Group, P.C.; G. Victor Treys; Zachary D. Hadd

(57) ABSTRACT

An electronic device may be provided with electronic device structures such as housing structures, antenna structures, printed circuits, and structures associated with electrical components. The structures may be attached to each other using adhesive. A liquid pressure sensitive adhesive precursor material is deposited onto one or more surfaces of structures to be bonded. Light or heat can be applied to cure the liquid adhesive material and form pressure sensitive adhesive layers. During curing, chemical bonds are formed between the adhesive material and the structures. Assembly equipment may press the structures together to form pressure sensitive adhesive bonds that can be reworked without disturbing the chemically bonded portions of the adhesive material. The pressure sensitive adhesive may include conductive particles for forming conductive paths.

14 Claims, 10 Drawing Sheets

LIQUID-BASED PRESSURE SENSITIVE ADHESIVE FOR GROUNDING APPLICATIONS

BACKGROUND

This relates generally to adhesives and, more particularly, to pressure sensitive adhesives formed from liquid that can be used for coupling structures in electronic devices.

Adhesives are widely used to attach structures to each other. As an example, electronic devices such as computers and cellular telephones often contain adhesives for mounting components to housing structures, for attaching housing structures to each other, and for otherwise assembling structures within a completed device.

Liquid adhesives can be applied between parts to be joined. Heat or ultraviolet light can be applied to cure a liquid adhesive and form an adhesive joint between the parts. Liquid adhesive joints of this type can be difficult to control and may not be reworkable.

Pressure sensitive adhesives form bonds under pressure. The use of pressure sensitive adhesives is often preferred over liquid adhesives due to ease of assembly and, in some situations, an ability to rework assembled parts. Metal particles can be included in pressure sensitive adhesives to promote conduction. A conductive pressure sensitive adhesive may be used to form a ground path in an electronic device.

Pressure sensitive adhesive joints can be formed from pressure sensitive adhesive tape. Pressure sensitive adhesive tape includes a plastic carrier film that it typically die cut to form pressure sensitive adhesive areas in desired patterns. Assembly of parts using tape-based pressure sensitive adhesive tape can be cumbersome. Tape-based joints are also sometimes difficult to rework, because they tend to tear unpredictably and leave unwanted residues on disassembled parts.

It would therefore be desirable to be able to provide improved pressure sensitive adhesive joints for electronic devices.

SUMMARY

An electronic device may be provided with electronic device structures such as housing structures, antenna structures, printed circuits, and structures associated with electrical components. The structures may be attached to each other using adhesive. The adhesive may be pressure sensitive adhesive that is deposited in liquid form.

A liquid pressure sensitive adhesive precursor material can be deposited onto one or more surfaces of structures to be bonded using screen printing equipment or other liquid dispensing equipment. Light or heat can be applied to cure the liquid adhesive material and form pressure sensitive adhesive layers. During curing, chemical bonds can be formed between the adhesive material and the structures. The pressure sensitive adhesive layers that are formed in this way can be assembled manually or using automated equipment.

For example, assembly equipment may press structures together to form pressure sensitive adhesive bonds. In joints with multiple layers of pressure sensitive adhesive joined along an interface, rework is possible. The multiple layers can be pulled apart along the interface without removing the adhesive from the structures. Ferromagnetic material in the adhesive can provide shielding. The adhesive may also be provided with metal particles to form conductive pressure sensitive adhesive. Conductive pressure sensitive adhesive may be used to short together the structures that are being joined.

The use of liquid-based pressure sensitive adhesive in forming adhesive joints may help ensure good coverage of structures being bonded, may reduce dependency of bonds to bonding conditions such as pressure, temperature and time, and may help minimize the amount of pressure that is required to form joints.

Further features, their nature and various advantages will be more apparent from the accompanying drawings and the following detailed description of the preferred embodiments.

DETAILED DESCRIPTION

Figure 1:
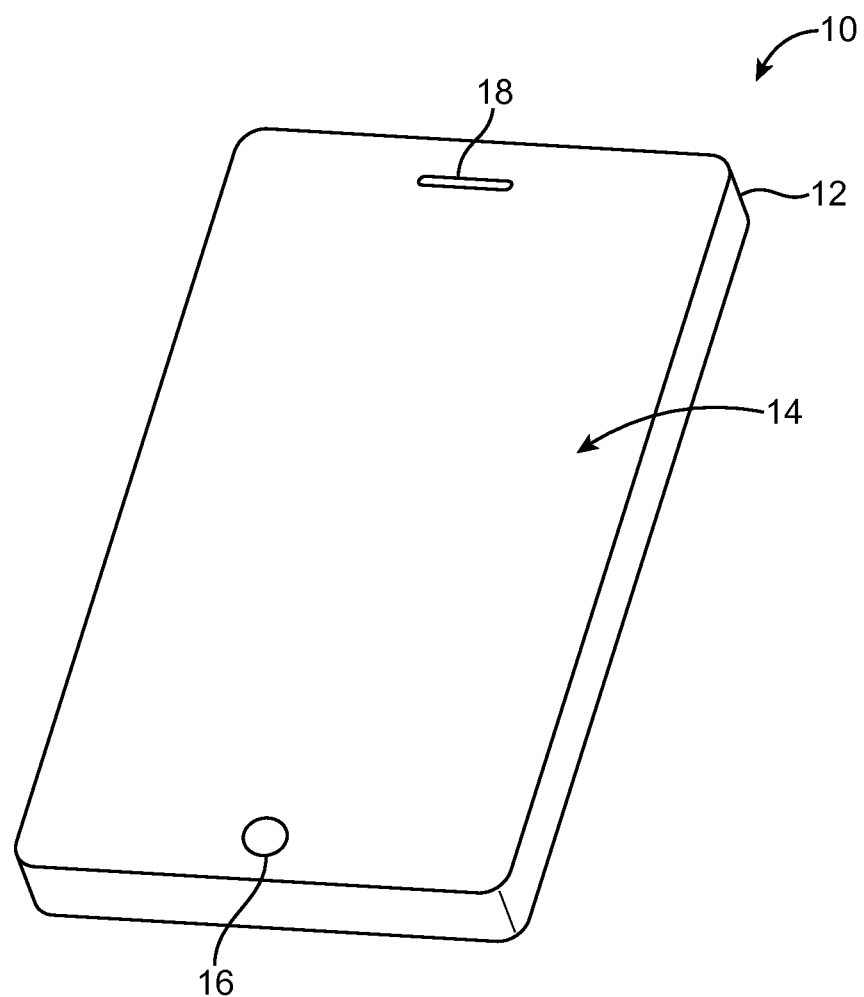
FIG. 1 is a perspective view of an illustrative electronic device of the type that may contain structures that are attached to each other with adhesive in accordance with an embodiment.

Adhesive may be used to join structures formed from metal, ceramics, glass, plastic, and other conductors and dielectric materials. An illustrative device of the type that may include structures joined using adhesive is shown in FIG. 1. Electronic device 10 may be a computer such as a computer that is integrated into a display such as a computer monitor, a laptop computer, a tablet computer, a somewhat smaller portable device such as a wrist-watch device, pendant device, or other wearable or miniature device, a handheld device such as a cellular telephone, a media player, a tablet computer, a gaming device, a navigation device, a computer monitor, a television, or other electronic equipment.

As shown in FIG. 1, device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16. An opening may also be formed in the display cover layer to accommodate ports such as speaker port 18.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.). The periphery of housing 12 may, if desired, include walls. For example, housing 12 may have a peripheral conductive member such as a metal housing sidewall member that runs around some or all of the periphery of device 10 or may have a display bezel that surrounds display 14. Housing 12 may have sidewalls that are curved, sidewalls that are planar, sidewalls that have a combination of curved and flat sections, and sidewalls of other suitable shapes. One or more openings may be formed in housing 12 to accommodate connector ports, buttons, and other components.

It may be desirable to join internal housing structures, electrical components in device 10, housing 12, mechanical structures in device 10, and other structures in device 10 using adhesive. The adhesive that is used in joining the structures of device 10 or that is used in joining other structures may be formed from a liquid adhesive (sometimes referred to as liquid pressure sensitive adhesive precursor material) that is applied to one or more surfaces of the structures to be joined. Using thermal or ultraviolet light curing, the applied liquid adhesive may be cured to form one or more layers of pressure sensitive adhesive. As part of the curing process, the pressure sensitive adhesive forms chemical bonds with the surface to which the liquid adhesive was applied. Following formation of one or more layers of pressure sensitive adhesive in this way, the structures that are to be joined may be pressed together. The pressing process compresses the pressure sensitive adhesive and forms a pressure sensitive adhesive joint. The pressure sensitive adhesive joint may be pulled apart to rework or repair the structures being joined, generally without breaking the chemical bonds at the interface between the pressure sensitive adhesive and the structures on which the pressure sensitive adhesive was cured.

Figure 2:
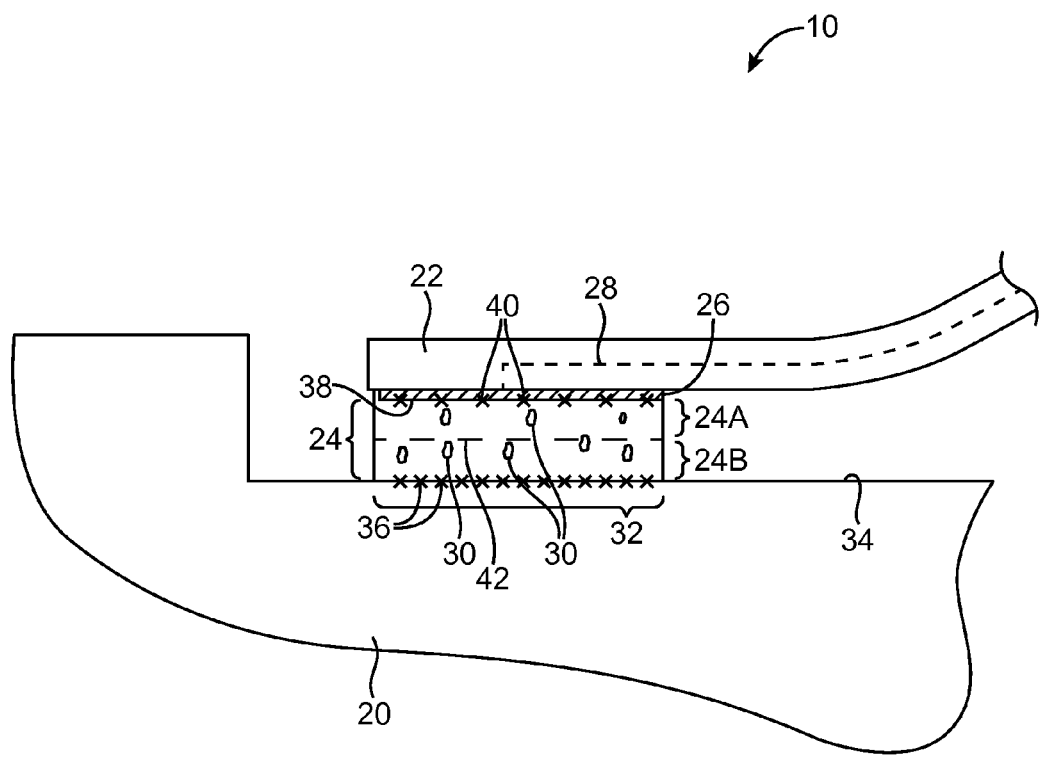
FIG. 2 is a side view of structures in an electronic device such as a flexible printed circuit and metal housing member that are being joined using adhesive in accordance with an embodiment.

Consider, as an example, the cross-sectional side view of FIG. 2. In the example of FIG. 2, an adhesive joint formed from pressure sensitive adhesive 24 is being used to join structures in device 10 such as structures 20 and 22. Structures 20 and 22 may be portions of housing 12, brackets and other internal housing structures, display structures, cables, flexible printed circuits, rigid printed circuits, optical components, electrical components, conductive structures, or other electronic device structures. As an example, structure 20 may be a metal member such as a metal housing member or other conductive structure that serves as an electrical ground and structure 22 may be a printed circuit such as a flexible printed circuit. Flexible printed circuit 22 may contain patterned metal traces such as metal traces 28 for forming signal lines that convey signals or for forming structures such as antenna structures. One or more layers of dielectric substrate material such as polyimide or other polymers may be used in forming flexible printed circuit 22. Surface contacts such as metal trace 26 may be used to form electrical contact with adhesive 24. Metal trace 26 may, as an example, form a rectangular contact pad on the lower surface of flexible printed circuit 22 that is facing the opposing upper surface of metal housing structure 20.

Examples of metals that may be used in forming some or all of the traces for flexible printed circuit 22 include copper, gold, and aluminum. Metal housing 20 may be formed from stainless steel or aluminum (as examples). Pressure sensitive adhesive 24 may be nonconductive or may, if desired, contain conductive materials such as metal particles 30. In configurations for pressure sensitive adhesive 24 in which pressure sensitive adhesive 24 has been provided with metal particles, pressure sensitive adhesive 24 may be conductive. Conductive pressure sensitive adhesive 24 may be used to form electrical pathways between the structures that are being joined. For example, conductive pressure sensitive adhesive 24 may be used to electrically couple pad 26 and trace 28 of flexible printed circuit 22 to metal housing 20 or may be used to short together and ground other conductive structures. To ensure satisfactory electrical contact between flexible printed circuit 22 and housing 20, portion 32 of metal housing member 20 may be laser etched or otherwise treated to remove any oxides that are present in other areas on the surface of metal housing 20.

Pressure sensitive adhesive 24 may be deposited as a liquid (e.g., conductive liquid pressure sensitive adhesive precursor) and cured on the surfaces of respective structures such as structures 20 and 22. For example, a screen printing process or other liquid deposition process may be used to form layer 24B in a particular area on surface 34 of housing structure 20. A screen printing process may also be used to form layer 24A in a particular area on surface 38 of flexible printed circuit 22. For example, liquid for layer 24A may be deposited in a pattern having a footprint that overlaps and covers contact pad 26.

After depositing liquid pressure sensitive adhesive precursor material in desired patterns on surfaces 34 and 38, the liquid material may be cured. For example, an elevated temperature (e.g., a temperature that is 30° C. or more, 40° C. or more, 50° C. or more or 60° C. or more above room temperature) may be applied to the liquid to drive off any solvents in the liquid. As another example, ultraviolet light from an ultraviolet light source such as an ultraviolet lamp or ultraviolet laser may be used to cure the liquid pressure sensitive adhesive precursor material. Visible light curing may also be used. Following curing, there will be two pressure sensitive adhesive layers—one on surface 34 of metal housing 20 and one on surface 38 of flexible printed circuit 22. During curing, chemical bonds may form between the adhesive material and structures 20 and 22. For example, chemical bonds 36 may form between the lower surface of pressure sensitive adhesive layer 24B and surface 34 of metal housing member 20. Chemical bonds 40 may form between surface 38 of flexible printed circuit 22 (i.e., the surface of metal pad 26) and the upper surface of pressure sensitive adhesive layer 24A.

To form adhesive layer 24 after the liquid pressure sensitive adhesive precursor material has been cured to form pressure sensitive adhesive layers 24A and 24B, structures 22 and 20 may be pressed together. This causes layer 24A to press against layer 24B along interface 42, thereby forming a pressure-sensitive-adhesive-to-pressure-sensitive-adhesive joint (joint 42). When it is desired to pull apart the joint that is formed between pressure sensitive adhesive layers 24A and 24B, flexible printed circuit 22 can be pulled away from housing structure 20. Chemical bonds 36 and 40 will be stronger than pressure-sensitive-adhesive-to-pressure-sensitive-adhesive bond 42, so adhesive 24 will tend to pull apart along the interface of bond 42, leaving adhesive layer 24B on surface (and leaving adhesive layer 24A on flexible printed circuit 22). If desired, a component such as flexible printed circuit 22 can be replaced with a fresh component to repair faulty structures on flexible printed circuit 22. Traces 28 may form antenna resonating element structures (e.g., inverted-F antenna resonating element structures or other antennas), may form a communications bus (e.g., a communications path with parallel metal lines for carrying serial and/or parallel data, may form a printed circuit that is populated with integrated circuits and other components, or may form other structures for device 10.

Figure 3:
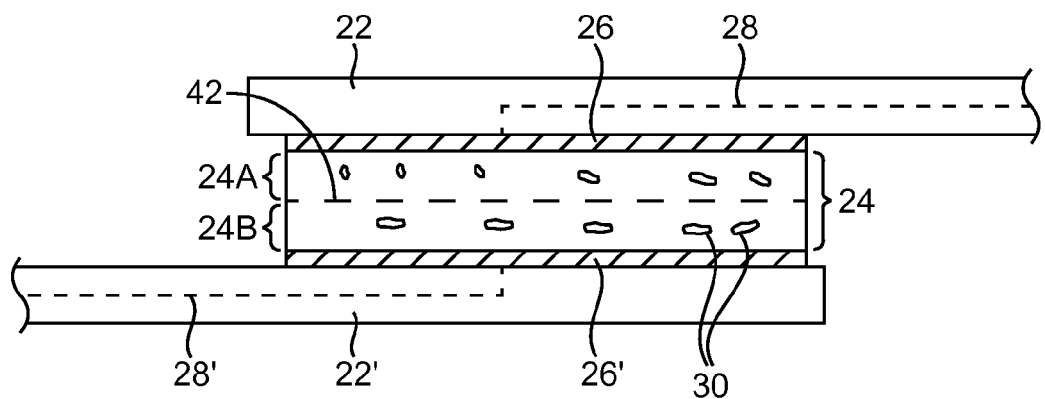
FIG. 3 is a side view of structures in an electronic device such as a pair of printed circuits that are being joined using adhesive in accordance with an embodiment.

In the illustrative configuration of FIG. 3, two flexible printed circuits have been joined using pressure sensitive adhesive 24. As shown in FIG. 3, pressure sensitive adhesive 24 includes a first layer such as upper layer 24A that is formed on the surface of metal pad 26 on flexible printed circuit 22. Metal pad (metal trace) 26 may be coupled to other metal structures in printed circuit 22 such as metal traces 28. Pressure sensitive adhesive 24 also includes a second layer such as lower layer 24B that is formed on the surface of metal pad 26', which is coupled to metal traces 28' in flexible printed circuit 22'.

Figure 4:
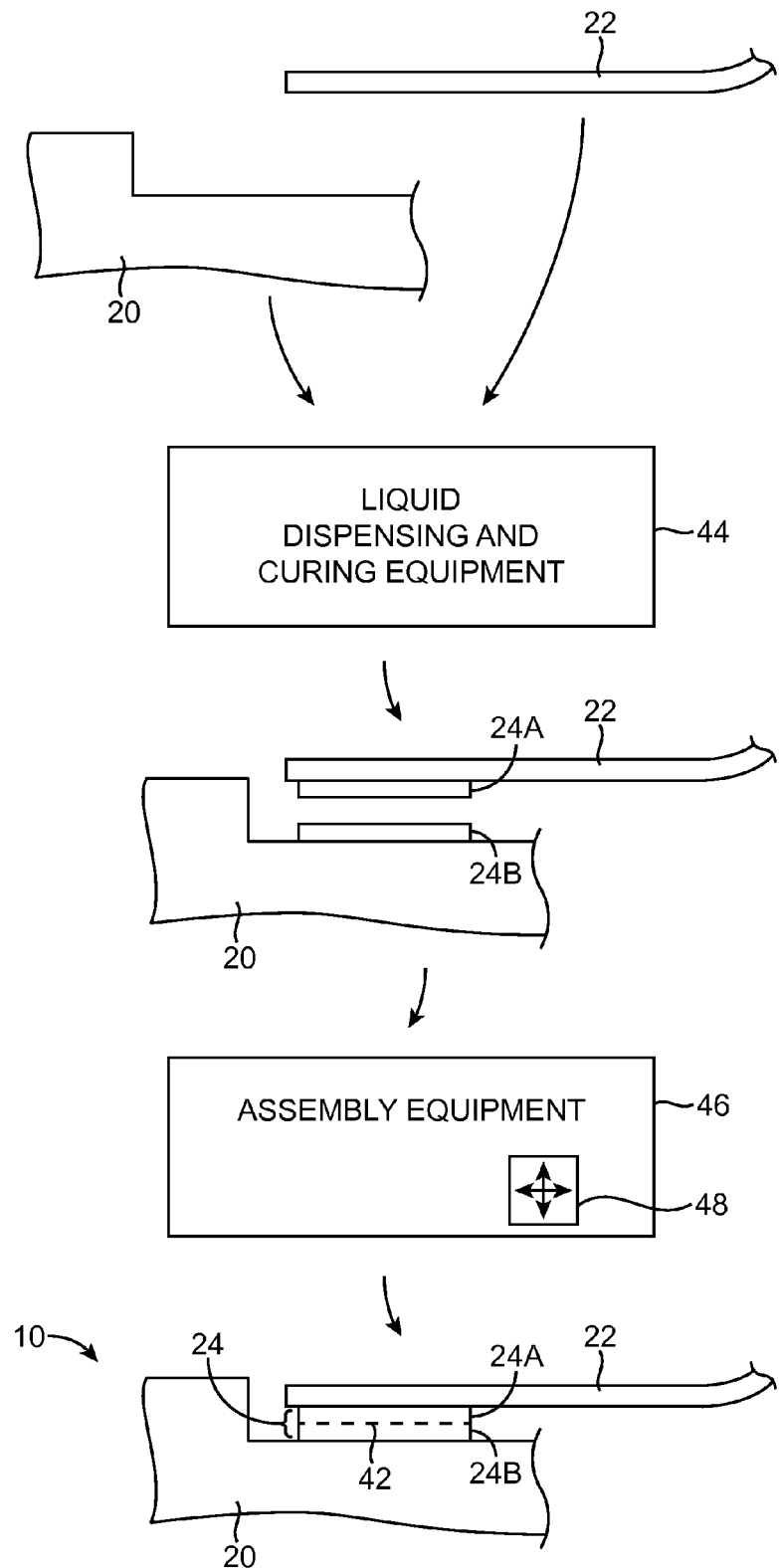
FIG. 4 is a diagram of equipment and operations involved in forming an adhesive joint between structures in an electronic device in accordance with an embodiment.

FIG. 4 is a diagram of illustrative equipment and steps involved in forming a pressure sensitive adhesive bond between respective structures using pressure sensitive adhesive 24. As shown in FIG. 4, structures to be bonded together such as structures 20 and 22 may be coated with liquid pressure sensitive adhesive precursor layers using liquid dispensing and curing equipment 44. Equipment 44 may then cure the deposited liquid layers to form pressure sensitive adhesive layers 24A and 24B. Liquid dispensing equipment in equipment 44 may include screen printing equipment, pad printing equipment, spraying equipment, jet printing equipment, slit dispenser equipment, needle dispenser equipment, rollers, and other equipment for dispensing liquid. The liquid adhesive that is dispensed may contain metal particles 30 (FIGS. 2 and 3) so that pressure sensitive adhesive layers 24A and 24B are conductive. Metal particles 30 may be, for example, silver particles. Adhesive layers 24A and 24B may be silver-filled acrylic polyurethane or polyether with silane-terminated ends (as one example).

Curing equipment in equipment 44 may include an oven for supplying heat to elevate the temperature of adhesive 24. For example, equipment 44 may contain a hot plate or other structure for heating the liquid of adhesive 24, thereby evaporating solvents in the liquid and forming cured pressure sensitive adhesive layers. As another example, equipment 44 may contain an ultraviolet (UV) light lamp, an ultraviolet laser, or other source of ultraviolet light for UV curing the liquid adhesive material to form pressure sensitive adhesive 24. Following curing of the liquid material, pressure sensitive adhesive layer 24A may be formed on structure 22 (e.g., a flexible printed circuit or other structure such as a conductive structure) and pressure sensitive adhesive layer 24B may be formed on structure 20 (e.g., a metal housing structure or other structure such as a conductive structure).

Assembly equipment 46 may contain manually operated and computer-controlled equipment for pressing together structures 20 and 22. For example, assembly equipment 46 may include computer-controlled positioner 48. During assembly operations, assembly personnel may manually join structures 22 and 20 or computer-controlled positioner 48 may be used in joining structures 22 and 20 by pressing together structures 22 (and adhesive 24A) and structures 20 (and adhesive 24B), thereby forming pressure-sensitive-adhesive-to-pressure-sensitive-adhesive interface 42 in adhesive 24.

Figure 5:
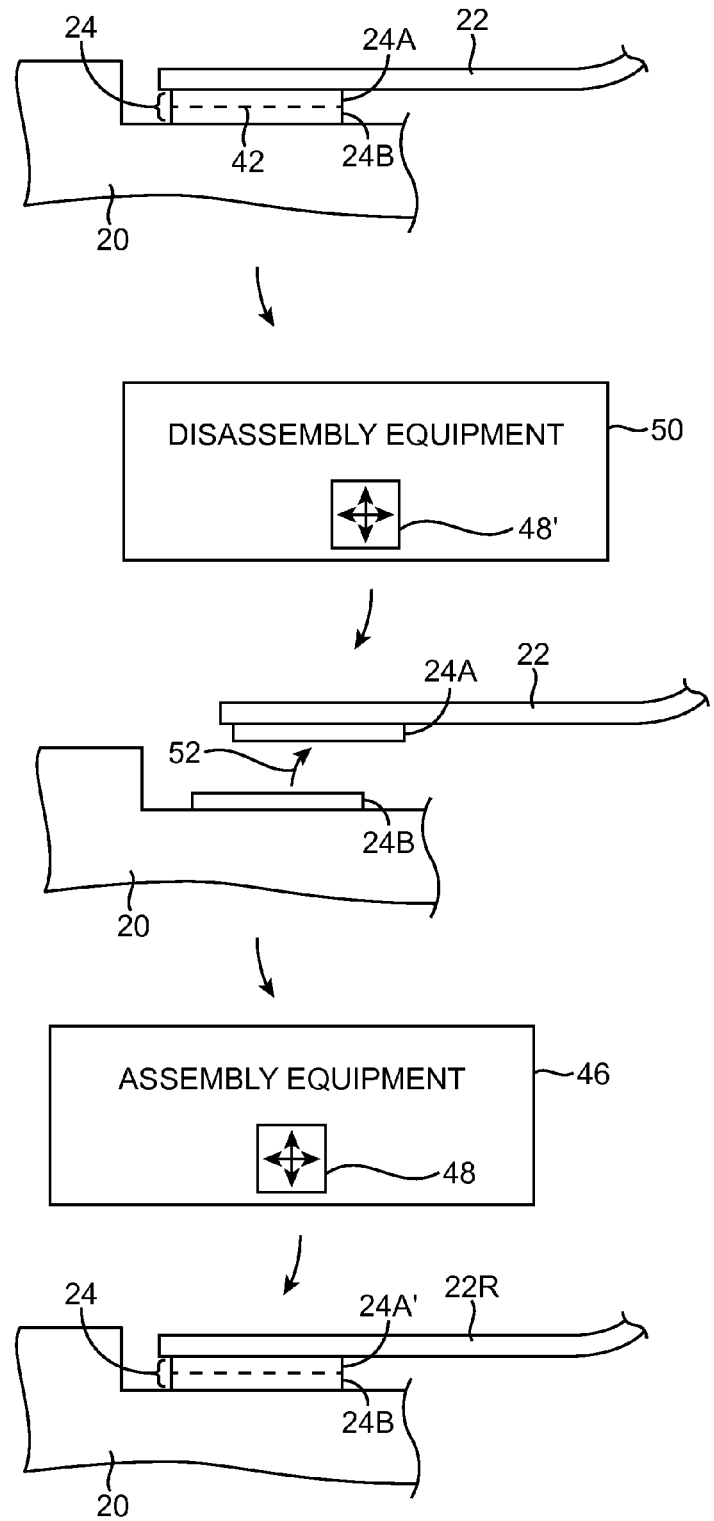
FIG. 5 is a diagram of equipment and operations that may be used to disassemble and repair an electronic device having an adhesive joint in accordance with an embodiment.

Disassembly equipment and operations of the type that may be used in connection with the adhesive bond formed using liquid dispensed pressure sensitive adhesive are shown in FIG. 5. As shown in FIG. 5, structures 20 and 22 may be bonded using pressure sensitive adhesive 24 (e.g., using techniques of the type shown in FIG. 4). Disassembly equipment 50 may include computer-controlled positioners such as computer-controlled positioner 48'. When it is desired to disassemble structures 20 and 22 to replace a faulty structure such as structure 22, positioner 48' may be used to pull apart flexible printed circuit structure 22 and housing structure 20, as illustrated by arrow 52. Because the bond along interface 42 between the two joined pressure sensitive adhesive layers is weaker than the respective bonds formed by the chemical bonds between adhesive 24 and structures 20 and 22, adhesive 24 will tend to tear apart smoothly along interface 24. As a result, adhesive such as cured pressure sensitive adhesive 24B will generally be undamaged and may be used to form part of a new pressure sensitive adhesive joint.

As an example, assembly equipment 46 may use computer-controlled positioner 48 to attach replacement flexible printed circuit 22R to structures 20. Replacement flexible printed circuit 22R may have a substrate on which adhesive layer 24A' has been formed (e.g., using liquid adhesive dispensing such as screen printing followed by curing). Adhesive joint 24 of FIG. 5 may be formed by pressing substrate 22R against metal housing 20.

Figure 6:
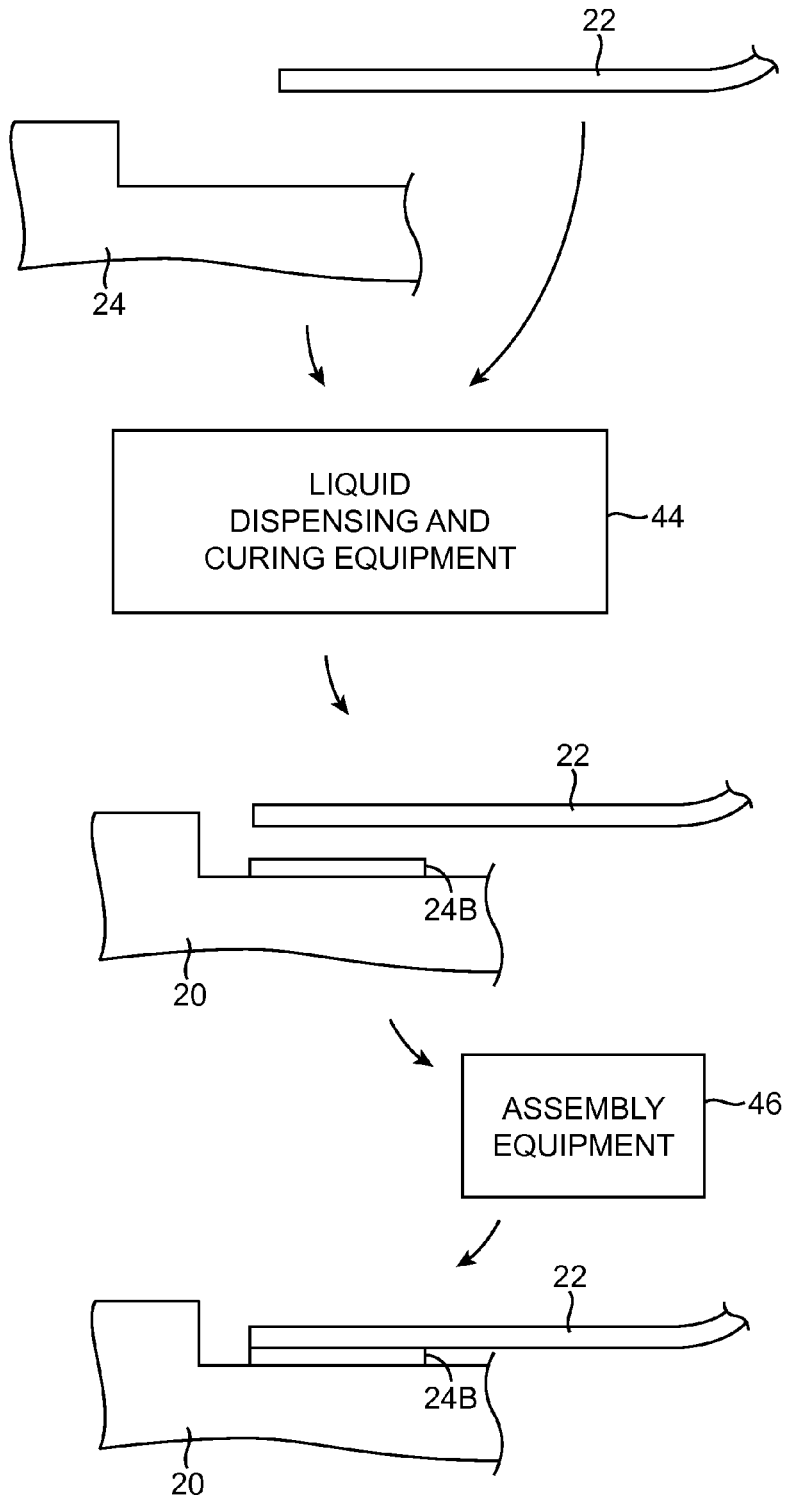
FIG. 6 is a diagram of equipment and operations involved in forming a pressure sensitive adhesive joint in which liquid adhesive for forming a layer of pressure sensitive adhesive is applied to one of a pair of surfaces to be joined in accordance with an embodiment.

In the illustrative configuration of FIG. 6, pressure sensitive adhesive 24 has been formed on only a single one of surfaces of the structures being joined. Initially, structures 20 and 22 are free of adhesive. Liquid dispensing and curing equipment 44 applies liquid pressure sensitive adhesive material to structure 20 (or to structure 22) and cures the applied material to form pressure sensitive adhesive layer 24B. Assembly equipment 46 may then be used to press structures 22 and structures 20 together, thereby forming an adhesive bond between structures 22 and 20 using adhesive 24B. In this example, the lower surface of adhesive 24B forms chemical bonds with structures 20 and the upper surface of adhesive 24B forms pressure-sensitive adhesive bonds with structures 22. In the event of disassembly for rework or repair (see, e.g., FIG. 5), the upper bond formed by pressure sensitive adhesive 24B will break before the lower bond formed by adhesive 24B.

Figure 7:
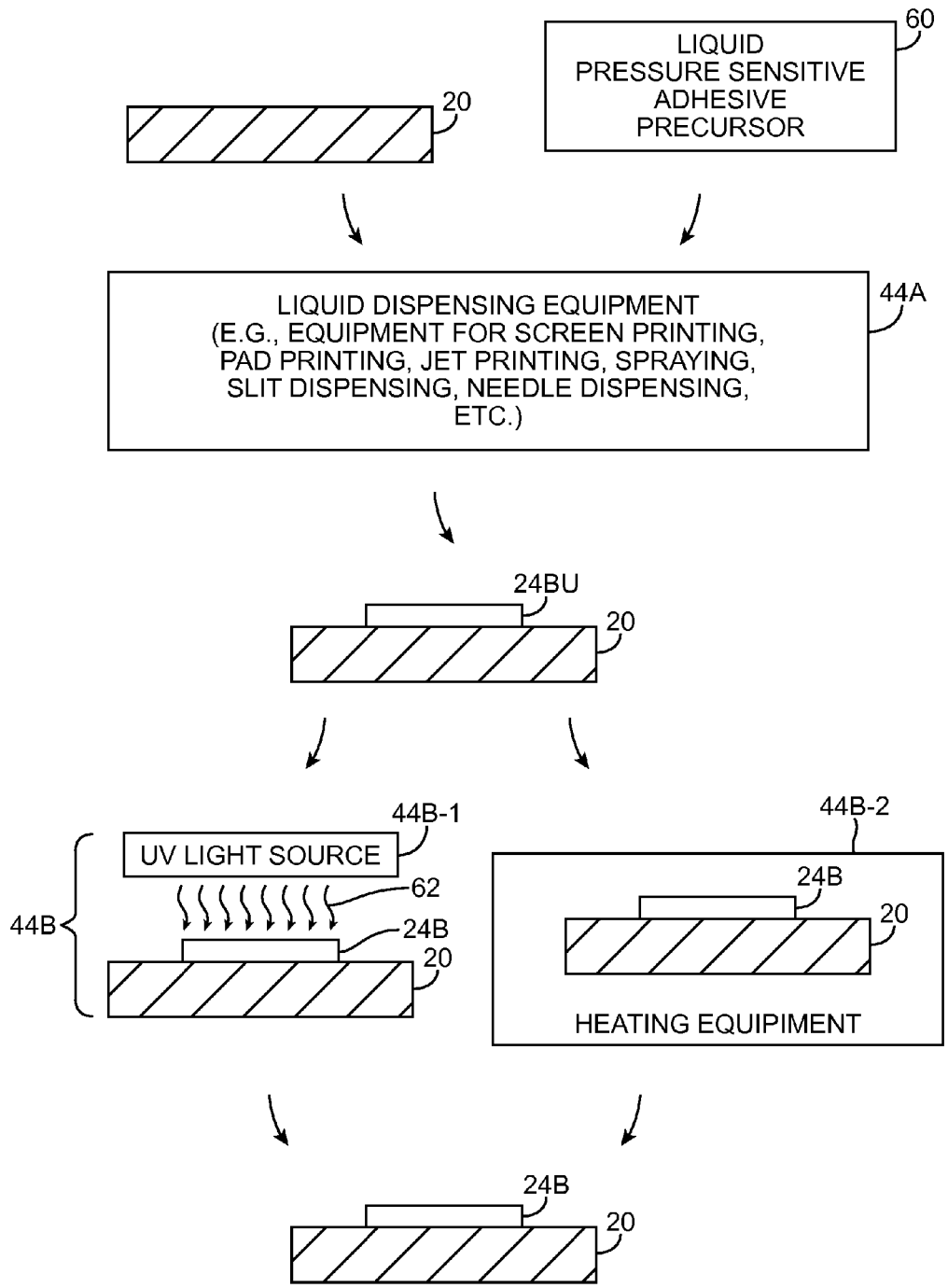
FIG. 7 is a diagram of equipment and operations involved in curing liquid adhesive material to form pressure sensitive adhesive layers on structures to be joined in accordance with an embodiment.

FIG. 7 is a diagram showing how liquid material (e.g., a liquid polymer such as a liquid pressure sensitive adhesive polymer precursor) may be dispensed and cured. Initially, structure 20 may be free of adhesive. Liquid pressure sensor adhesive material 60 may be dispensed onto the surface of structure 20 to form adhesive layer 24BU. Liquid dispensing equipment 44A (e.g., dispensing equipment in equipment 44) may include equipment for screen printing patterns of liquid adhesive onto structures to be joined, may include pad printing equipment, may include jet printing equipment slit dispensing equipment, needle dispensing equipment, etc.). Curing equipment 44B (e.g., curing equipment in equipment 44) may use an ultraviolet light source such as light source 44B-1 to apply ultraviolet light 62 or other curing light to the adhesive to patterned liquid adhesive 24BU, thereby curing the liquid adhesive and forming cured pressure sensitive adhesive layer 24B on structures 20. If desired, curing equipment 44B-2 such as an oven, hot plate, heat gun, heating lamp, or other heating equipment may be used to elevate the temperature of layer 24BU, thereby curing layer 24BU and forming pressure sensitive adhesive layer 24B on structures 20.

Figure 8:
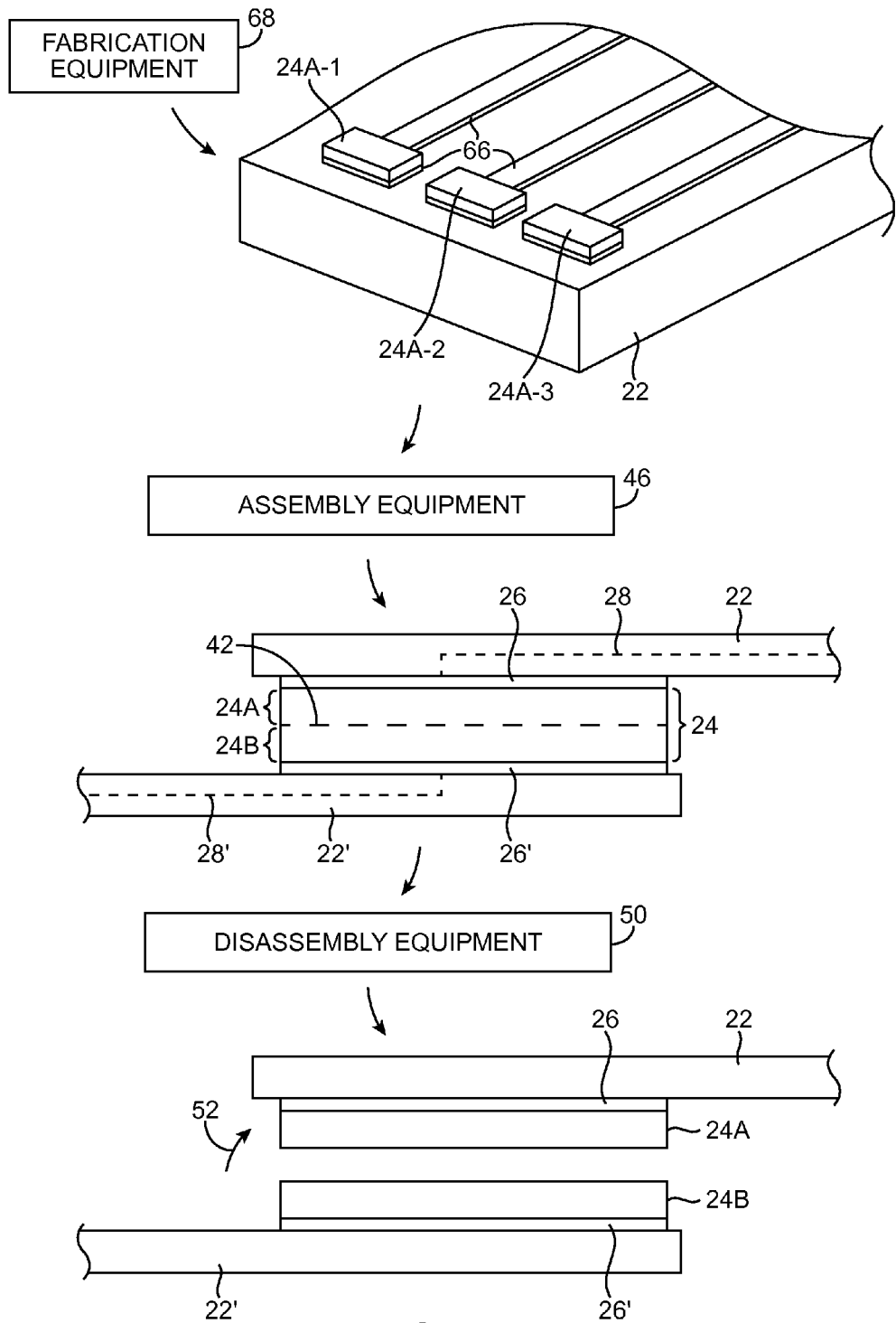
FIG. 8 is a diagram of equipment and operations involved in using conductive pressure sensitive adhesive bonds to form electrical connections between conductive structures such as metal traces on dielectric carriers in accordance with an embodiment.

Conductive pressure sensitive adhesive structures may, if desired, be used in forming electrical connections between respective signal lines such as metal traces on opposing printed circuits. As shown in FIG. 8, a substrate such as printed circuit 22 (e.g., a flexible printed circuit or a rigid printed circuit board) may be provided with signal lines such as metal traces 66 using fabrication equipment 68 (e.g., photolithographic patterning equipment, equipment for depositing metal, etc.). Equipment 68 may include equipment such as liquid dispensing and curing equipment 44 for dispensing liquid pressure sensitive adhesive precursor material and curing the liquid material to form pads of pressure sensitive adhesive 24A such as pads 24B-1, 24B-2, and 24B-3. Equipment 68 may also fabricate board 22' and pads of pressure sensitive adhesive 24B on board 22'. Assembly equipment 46 may press printed circuits 22 and 22' together to form a plurality of respective pressure sensitive adhesive joints formed from respective areas of pressure sensitive adhesive 24 (e.g., respective joined pads from upper and lower printed circuits). In this way, each signal line 66 on printed circuit 22 may be electrically shorted to a respective signal line on printed circuit 22' using a respective pressure sensitive adhesive joint.

During manufacturing, faults may be revealed in structures such as printed circuit 22. For example, if printed circuit 22 contains metal traces that form an antenna, antenna performance tests may reveal that an antenna resonating element is not performing satisfactorily. Rather than scrap device 10, disassembly equipment 50 may be used to pull apart printed circuits 22 and 22', as indicated by arrow 52 of FIG. 8. Because pressure sensitive adhesive 24 is configured to pull apart along the pressure sensitive adhesive interface 42, the pressure sensitive adhesive layers will not be damaged as part of the disassembly process, allowing repair. Following disassembly, assembly equipment 46 may be used to reattach a replacement antenna (i.e., a replacement flexible printed circuit) using pressure sensitive adhesive 24.

Figure 9:
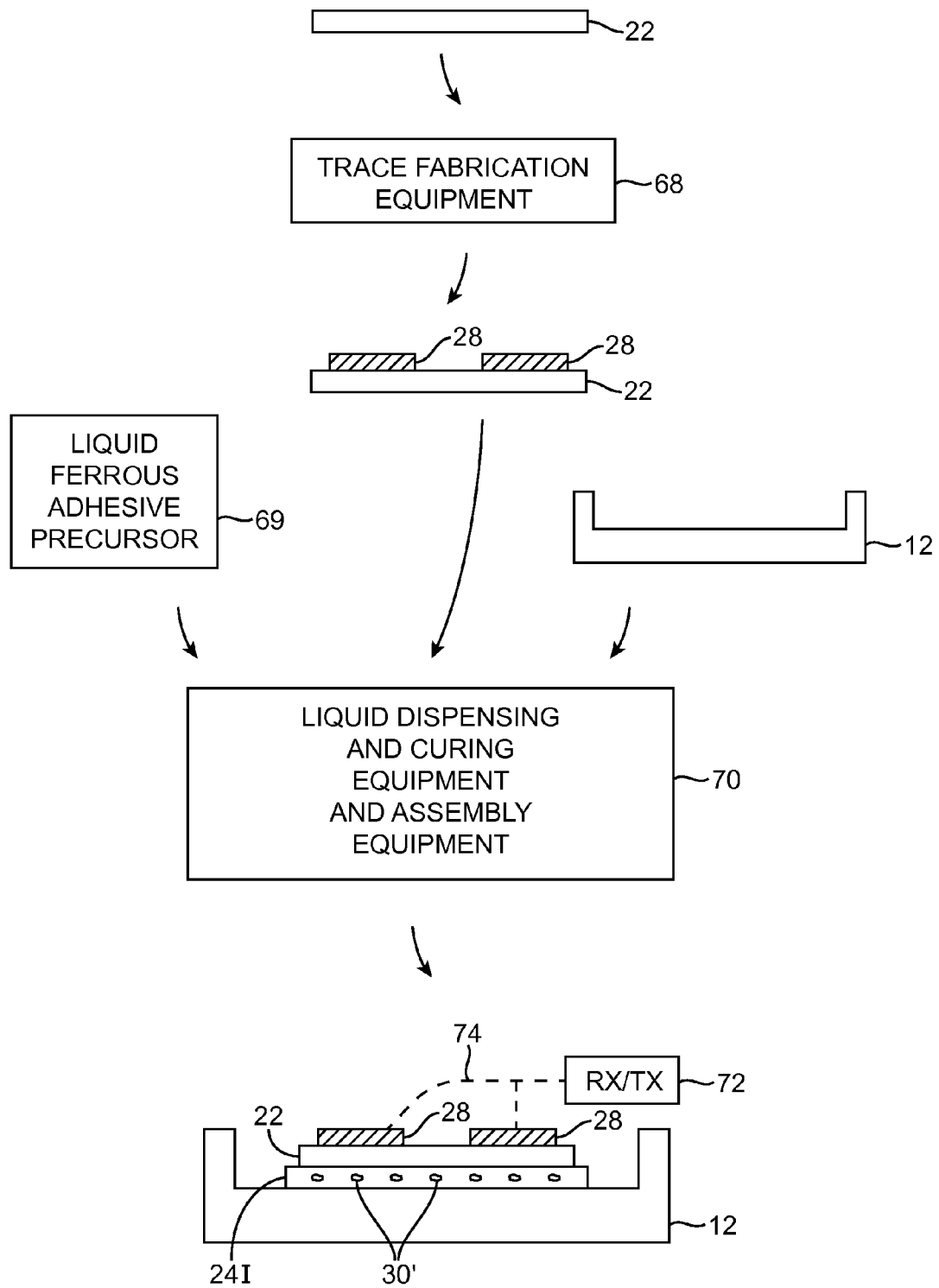
FIG. 9 is a diagram of equipment and operations involved in forming a ferrous electromagnetic shielding layer in an electronic device from a layer of liquid material in accordance with an embodiment.

If desired, adhesive 24 may incorporate ferrous particles (e.g., iron particles). This allows pressure sensitive adhesive layer 24 to serve as a ferrous electromagnetic shielding layer. Equipment and operations involved in forming a shielding layer using liquid ferrous adhesive precursor material are shown in FIG. 9. Initially, structures such as structures 20 are processed to form metal traces 28 using fabrication equipment 68. Equipment 68 may include tools for depositing metal and for photolithographically patterning the deposited metal to form patterned traces 28.

Traces 28 may be, for example, antenna traces. Structures 22 may be printed circuit structures. The antenna traces may be formed on the surface of printed circuit 22 and/or may be embedded within the layers of polyimide or other dielectric making up printed circuit 22. Liquid ferrous pressure sensitive adhesive precursor material 69 may be applied to a structure such as housing 12 using liquid dispensing and curing equipment and assembly equipment 70 (e.g., liquid dispensing and curing equipment 44 and assembly equipment 46), thereby forming cured pressure sensitive adhesive layer 24I. Printed circuit 22 may be attached to housing 12 (or other electronic device structures) using adhesive layer 24I. Metal traces 28 may be metal antenna traces coupled to radio-frequency transceiver circuitry 72 by transmission line 74. During operation, antenna traces 28 may generate wireless signals. Ferrous particles 30' in pressure sensitive adhesive layer 24I allow layer 24I to serve as electromagnetic shielding for the antenna formed from traces 28.

The layout of FIG. 9 is merely illustrative. Ferrous shielding layer 24I may be formed at other locations within device 10 and may be used in providing electromagnetic shielding for other types of components, if desired.

Figure 10:
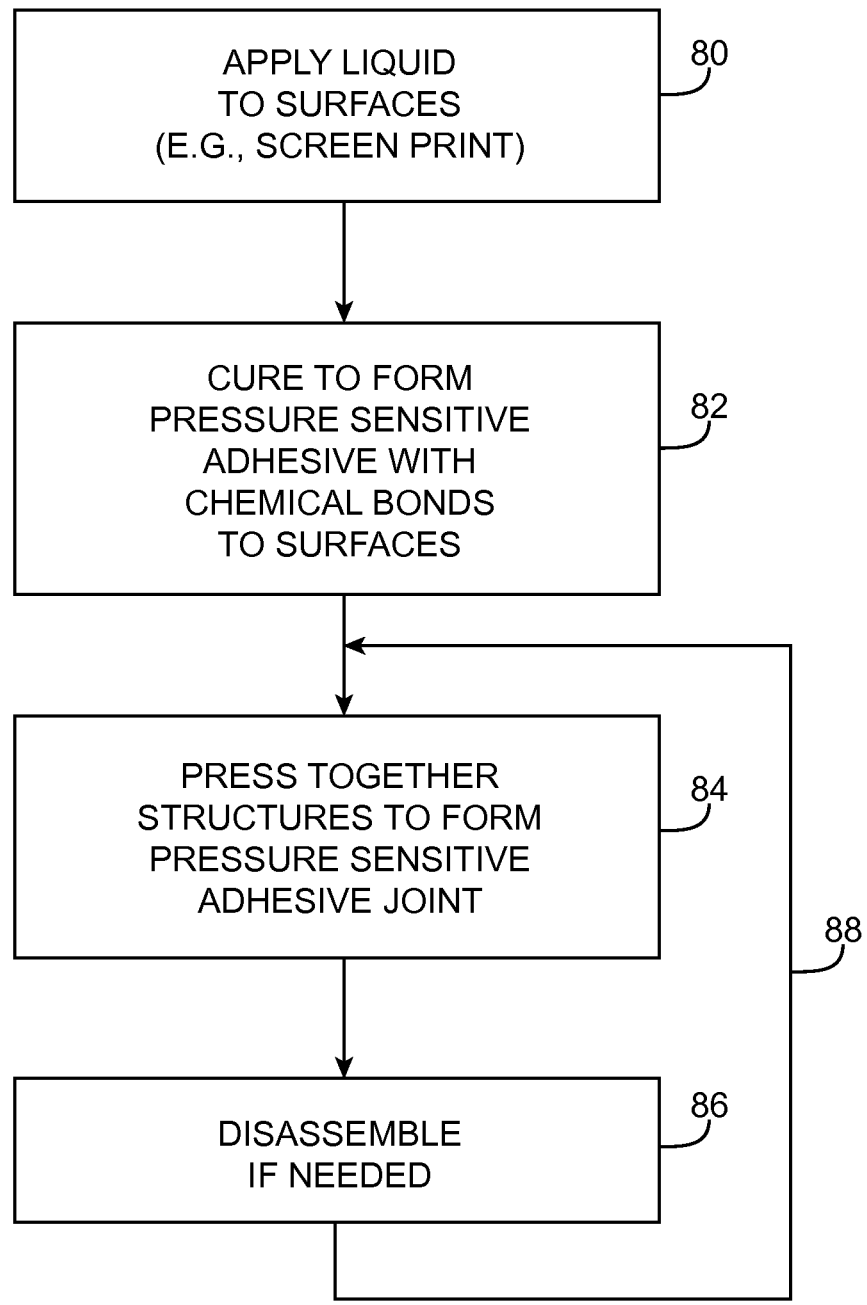
FIG. 10 is a flow chart of illustrative steps involved in forming adhesive joints using pressure sensitive adhesive that is applied to the structures to be joined in liquid form in accordance with an embodiment.

Illustrative steps involved in forming electronic devices with liquid-based pressure sensitive adhesive are shown in FIG. 10. At step 80, equipment such as equipment 44 may be used to deposit conductive liquid pressure sensitive adhesive precursor material on the surface(s) of structures to be joined. For example, screen printing or other deposition and patterning techniques may be used to form patterned liquid adhesive material.

At step 82, light or heat for curing the deposited liquid adhesive precursor material may be applied to the liquid material. During curing, chemical bonds are formed between the adhesive and the structures on which the adhesive has been deposited.

During the operations of step 84, the structures that are to be attached to each other are pressed together to form a pressure sensitive adhesive bond.

If desired, the bonded structures can be pulled apart (step 86). Pressure sensitive adhesive bonding (e.g., the pressure-sensitive-adhesive-to-pressure-sensitive adhesive interface in a system with mating pressure sensitive adhesive layers or the pressure sensitive adhesive bond formed when pressing the pressure sensitive adhesive against a structure to be bonded) is generally less robust than chemical bonding, so the pressure sensitive adhesive will typically come apart along the pressure-sensitive-adhesive-to-pressure-sensitive-adhesive interface or other location without chemical bonds. Because this does not generally damage the underlying pressure sensitive adhesive layers on the structures, the structures can be reworked or repaired, as indicated schematically by line 88.

The foregoing is merely illustrative and various modifications can be made by those skilled in the art without departing from the scope and spirit of the described embodiments. The foregoing embodiments may be implemented individually or in any combination.

What is claimed is:

1. A method for assembling structures in an electronic device, comprising:
    applying liquid pressure sensitive adhesive precursor material to a first structure in the electronic device;
    curing the liquid pressure sensitive adhesive precursor material on the first structure to form a first pressure sensitive adhesive layer;
    applying liquid pressure sensitive adhesive precursor material to a second structure in the electronic device;
    curing the liquid pressure sensitive adhesive precursor material on the second structure to form a second pressure sensitive adhesive layer; and
    pressing together the first and second pressure sensitive adhesive layers to attach the first and second structures.

2. The method defined in claim 1 wherein the first and second pressure sensitive adhesive layers comprise conductive pressure sensitive adhesive.

3. The method defined in claim 2 wherein the first structure comprises a metal electronic device housing and wherein curing the liquid pressure sensitive adhesive precursor comprises curing the liquid pressure sensitive adhesive precursor material on the metal electronic device housing.

4. The method defined in claim 1 wherein the first structure includes first metal traces, wherein the second structure includes second metal traces, and wherein pressing together the first and second pressure sensitive adhesive layers comprises forming a conductive pressure sensitive adhesive joint that shorts the first metal traces to the second metal traces.

5. The method defined in claim 1 wherein curing the liquid pressure sensitive adhesive precursor material comprises applying ultraviolet light to the liquid pressure sensitive adhesive precursor material.

6. The method defined in claim 1 wherein curing the liquid pressure sensitive adhesive precursor material comprises heating the liquid pressure sensitive adhesive precursor material to a temperature that is elevated above room temperature by at least 40° C.

7. The method defined in claim 1 wherein pressing together the first and second pressure sensitive adhesive layers forms a pressure-sensitive-adhesive-to-pressure-sensitive adhesive interface, the method further comprising pulling apart the first and second pressure sensitive adhesive layers along the pressure-sensitive-adhesive-to-pressure-sensitive adhesive interface without removing the first pressure sensitive adhesive layer from the first structure and without removing the second pressure sensitive adhesive layer from the second structure.

8. The method defined in claim 1 wherein the first structure comprises a flexible printed circuit, wherein the second structure comprises a metal housing, wherein the first and second pressure sensitive adhesive layers comprise conductive pressure sensitive adhesive, and wherein pressing together the first and second pressure sensitive adhesive layers comprises forming a conductive pressure sensitive adhesive joint that shorts metal traces in the flexible printed circuit to the metal housing.

9. The method defined in claim 1 wherein curing the liquid pressure sensitive adhesive precursor material on the first structure comprises forming chemical bonds between the first pressure sensitive adhesive layer and the first structure and wherein curing the liquid pressure sensitive adhesive precursor material on the second structure comprises forming chemical bonds between the second pressure sensitive adhesive layer and the second structure.

10. A method, comprising:
depositing a conductive liquid pressure sensitive adhesive precursor material on a first conductive structure;
curing the deposited liquid pressure sensitive adhesive precursor material on the first conductive structure to form a conductive pressure sensitive adhesive layer that is chemically bonded to the first conductive structure; and
shorting a second conductive structure to the first conductive structure through the conductive pressure sensitive adhesive layer, wherein the second conductive structure comprises a ground structure and wherein shorting the second conductive structure to the first conductive structure comprises grounding the first conductive structure to the conductive ground structure through the conductive pressure sensitive adhesive layer.

11. The method defined in claim 10 wherein shorting the second conductive structure comprises pressing a metal trace on a flexible printed circuit against the conductive pressure sensitive adhesive layer.

12. The method defined in claim 11 wherein depositing the conductive liquid pressure sensitive adhesive comprises screen printing the conductive liquid pressure sensitive adhesive precursor material.

13. The method defined in claim 12 wherein the flexible printed circuit includes an antenna formed from metal structures that are at least partly covered with the deposited liquid pressure sensitive adhesive material and wherein curing the deposited liquid pressure sensitive adhesive precursor material comprises applying light to the deposited liquid pressure sensitive adhesive precursor material on the metal structures.

14. The method defined in claim 13 further comprising:
depositing conductive liquid pressure sensitive adhesive precursor material on the second conductive structure; and
curing the deposited liquid pressure sensitive adhesive precursor material on the second conductive structure to form a conductive pressure sensitive adhesive layer that is chemically bonded to the second conductive structure, wherein shorting the second conductive structure to the first conductive structure comprises grounding the first conductive structure to the conductive ground structure through the conductive pressure sensitive adhesive layers on the first and second conductive structures.

\* \* \* \* \*